United States Patent
Okuda

(10) Patent No.: US 6,922,750 B2
(45) Date of Patent: *Jul. 26, 2005

(54) SEMICONDUCTOR MEMORY DEVICE CAPABLE OF SIMULTANEOUSLY READING DATA AND REFRESHING DATA

(75) Inventor: Masaki Okuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 303 days.

This patent is subject to a terminal disclaimer.

(21) Appl. No.: 10/046,754

(22) Filed: Jan. 17, 2002

(65) Prior Publication Data

US 2002/0156967 A1 Oct. 24, 2002

(30) Foreign Application Priority Data

Apr. 18, 2001 (JP) ........................................ 2000-119439

(51) Int. Cl.[7] ............................................... G06F 12/00
(52) U.S. Cl. .......................................... 711/106; 714/6
(58) Field of Search .......................... 711/106; 365/222, 365/189.04, 189.07

(56) References Cited

U.S. PATENT DOCUMENTS

| 4,766,573 A | 8/1988 | Takemae |
| 5,297,102 A | 3/1994 | Tanizaki |
| 6,108,229 A | 8/2000 | Shau |
| 6,421,292 B1 * | 7/2002 | Kitamoto et al. ........... 365/222 |
| 6,529,435 B2 * | 3/2003 | Yagishita et al. ........... 365/222 |

FOREIGN PATENT DOCUMENTS

JP   2000-368423   4/2000

* cited by examiner

Primary Examiner—Mano Padmanabhan
Assistant Examiner—Paul Baker
(74) Attorney, Agent, or Firm—Arent Fox PLLC

(57) ABSTRACT

A semiconductor memory device is capable of simultaneously reading data and refreshing data and checking whether a data restoring function is operating normally. A data inputting circuit receives data inputted from an external circuit. A parity generating circuit generates parity data from the data input from the data inputting circuit. A memory stores the data input from the data inputting circuit and the parity data generated by the parity generating circuit. A refreshing circuit refreshes the memory. A reading circuit reads the data from the memory. A restoring circuit restores data to be refreshed by the refreshing circuit from other data read normally and corresponding parity data, while the reading circuit is reading data. A data outputting circuit outputs the data read by the reading circuit and the data restored by the restoring circuit. A parity outputting circuit directly reads and outputs the parity data stored in the memory.

8 Claims, 16 Drawing Sheets

|       | MEMORY ARRAY |     |     | PARITY ARRAY |
|-------|-----|-----|-----|-----|
| 1-1   | 1-2 | 1-3 | 1-4 | 1P  |
| 2-1   | 2-2 | 2-3 | 2-4 | 2P  |
| 3-1   | 3-2 | 3-3 | 3-4 | 3P  |
| 4-1   | 4-2 | 4-3 | 4-4 | 4P  |

FIG. 11

SEMICONDUCTOR MEMORY DEVICE CAPABLE OF SIMULTANEOUSLY READING DATA AND REFRESHING DATA

BACKGROUND OF THE INVENTION (1) Field of the Invention

The present invention relates to a semiconductor memory device, and more particularly to a semiconductor memory device capable of simultaneously reading data and refreshing data.

(2) Description of the Related Art

Since DRAMs (Dynamic Random-Access Memories) are required to refresh memory cells, it has heretofore been customary to temporarily inhibit access from an external circuit while refreshing memory cells.

Temporary inhibition of access to a DRAM from an external circuit poses a disadvantage on the DRAM especially when there is a demand for high-speed access because the response time for access is prolonged by the temporary inhibition.

In view of the above drawback, the applicant filed a patent application on an invention relating to a semiconductor memory device (hereinafter referred to as "semiconductor memory device disclosed in a filed application") that can be accessed from an external circuit even while its memory cells are being refreshed (Japanese patent application No. 2000-368423).

FIG. 11 of the accompanying drawings is a diagram illustrative of the principles of operation of the semiconductor memory device disclosed in the filed application. As shown in FIG. 11, the semiconductor memory device disclosed in the filed application comprises a memory array of 16 subblocks and a parity array of 4 subblocks.

Each of the subblocks comprises a cell array in the form of a matrix of memory cells, a sense amplifier, and a decoder.

The subblocks of the memory array serve to store ordinary data, and the subblocks of the parity array serve to store parity data.

FIG. 12 of the accompanying drawings is a diagram illustrative of the manner in which data are read from the memory array. As shown in FIG. 12, when data are to be read from the memory array, data D1 through D4 are read from a row of subblocks (shown shaded).

FIG. 13 of the accompanying drawings is a diagram illustrative of the manner in which memory cells are refreshed. In the semiconductor memory device disclosed in the filed application, the subblocks are successively refreshed one at a time. In the example shown in FIG. 13, a subblock 2-3 shown hatched is to be refreshed. According to a specific example of operation, the subblocks of one row are refreshed successively from the left to the right. When all the subblocks of one row have been refreshed, then the subblocks of a next row start to be refreshed.

FIG. 14 of the accompanying drawings is a diagram illustrative of the manner in which subblocks are refreshed and data are read concurrently, with subblocks to be refreshed and subblocks to read data from overlapping each other.

In the example shown in FIG. 14, data are to be read from subblocks 2-1 through 2-4 of the memory array, and data in subblock 2-3 of the memory array are to be refreshed.

In this case, since the data cannot be read from the subblock 2-3, the semiconductor memory device disclosed in the filed application supplies data output from the subblocks 2-1, 2—2, 2-4 and parity data read from a subblock 2P to a data restoring circuit 200, which restores the data of the subblock 2-3 from the supplied data.

FIG. 15 is a block diagram of a detailed arrangement of the semiconductor memory device disclosed in the filed application.

As shown in FIG. 15, the semiconductor memory device disclosed in the filed application comprises an XOR circuit 10, a parity cell 11, DQ0 through DQ3 cells 12 through 15, an XOR circuit 16, a refresh signal generating circuit 17, and selectors 18 through 21.

The XOR circuit 10 XORs data DQ0 through DQ3 input thereto, and writes the result as parity data in the parity cell 11.

The DQ0 through DQ3 cells 12 through 15 store data input thereto, and supply data read according to a readout request to the selectors 18 through 21.

The refresh signal generating circuit 17 generates refresh signals for refreshing the DQ0 through DQ3 cells 12 through 15, and supplies the generated refresh signals to the selectors 18 through 21. In the illustrated example, the DQ0 cell 12 is shown hatched and is being refreshed. Therefore, only the refresh signal output from the refresh signal generating circuit 17 to the selector 18 is "H" (high in level), and the other refresh signals output from the refresh signal generating circuit 17 to the selectors 19 through 21 are "L" (low in level).

If both the output signal from the XOR circuit 16 and the output signal from the refresh signal generating circuit 17 are "H", then the selectors 18 through 21 select and output signals which are an inversion of the output signals from the DQ0 through DQ3 cells 12 through 15. Otherwise, the selectors 18 through 21 directly output the output signals from the DQ0 through DQ3 cells 12 through 15.

FIG. 16 is a block diagram of a detailed arrangement of the selectors 18 through 21.

As shown in FIG. 16, each of the selectors 18 through 21 comprises a NAND element 30, inverters 31, 32, and transfer circuits 33, 34.

The NAND element 30 supplies an inversion of the logical product of the output signal (hereinafter referred to as "refresh signal") from the refresh signal generating circuit 17 and the output signal (hereinafter referred to as "XOR signal") from the XOR circuit 16, to the inverter 31, an inverting input terminal of the transfer circuit 33, and a non-inverting input terminal of the transfer circuit 34.

The inverter 31 supplies the inversion of the output signal from the NAND element 30 to a non-inverting input terminal of the transfer circuit 33 and an inverting input terminal of the transfer circuit 34.

The inverter 32 supplies an inversion of the output signal from the corresponding cell, which is either one of the DQ0 through DQ3 cells 12 through 15, to the transfer circuit 33.

If the output signal from the NAND element 30 is "L", then the transfer circuit 33 directly outputs the signal from the inverter 32.

If the output signal from the NAND element 30 is "H", then the transfer circuit 34 directly outputs the cell data.

Operation of the semiconductor memory device disclosed in the filed application will be described below.

When the input data DQ0 through DQ3 are supplied, the XOR circuit 10 XORs the supplied data, and supplies the result to the parity cell 11. The parity cell 11 stores the output signal from the XOR circuit 10 as parity data.

The DQ0 through DQ3 cells 12 through 15 store the input data DQ0 through DQ3, respectively. Since input data DQ0 through DQ3 are all "1" in this example, the DQ0 through DQ3 cells 12 through 15 store "1", and the parity cell 11 stores "0" which is the exclusive OR of input data DQ0 through DQ3.

When there is a request for reading data at this time, the data are read from the DQ0 through DQ3 cells 12 through 15 and the parity cell 11. If the DQ0 cell 12 is to be refreshed at this time, then since the data cannot properly be read from the DQ0 cell 12, any data read therefrom are undefined (?).

The XOR circuit 16 XORs the data read from the DQ0 through DQ3 cells 12 through 15 and the parity data read from the parity cell 11, and supplies the exclusive OR as an XOR signal to the selectors 18 through 21. The XOR signal is "H" if the data written in the DQ0 through DQ3 cells 12 through 15 and the data read from the DQ0 through DQ3 cells 12 through 15 do no agree with each other, and is "L" otherwise. Therefore, the XOR signal which is "H" represents an error.

In this example, the data DQ0 is undefined. If the data DQ0 is "1", then the data written in the DQ0 through DQ3 cells 12 through 15 and the data read from the DQ0 through DQ3 cells 12 through 15 agree with each other, and hence the XOR signal is "L". If the data DQ0 is "0", then the data written in the DQ0 through DQ3 cells 12 through 15 and the data read from the DQ0 through DQ3 cells 12 through 15 do not agree with each other, and hence the XOR signal is "H".

If the XOR signal is "H", then since the signal supplied from the refresh signal generating circuit 17 to the selector 18 is "H", the output signal from the NAND element 30 is "L". As a result, the transfer circuit 33 is turned ON, outputting a signal "1" which is an inversion of the input DQ0 which is "0". Because the output signal "1" is the same as the input DQ0, the data is properly restored.

If the output signal from the DQ0 cell 12 is "1", then since the XOR signal is "L", the output signal from the NAND element 30 is "H". As a result, the transfer circuit 34 is turned ON, directly outputting the input DQ0.

Since the output signals supplied from the refresh signal generating circuit 17 to the selectors 19 through 21 are "L", the output signals from the NAND elements 30 of the respective selectors 19 through 21 are "H", turning ON the transfer circuit 34. The transfer circuit 34 thus directly outputs the data read from the DQ1 through DQ3 cells 13 through 15.

As described above, even when the semiconductor memory device disclosed in the filed application operates simultaneously in a refresh mode and a readout mode, the data stored in the cell that is being refreshed is restored from the parity data stored in the parity cell 11 and the other data. Therefore, the refresh mode and the readout mode can be carried out concurrently with each other, resulting in an increase in the access speed.

The semiconductor memory device disclosed in the filed application is disadvantageous in that since the parity data stored in the parity cell 11 cannot directly be read and written, it is difficult to determine whether the parity cell 11 and the function associated therewith, i.e., the data restoring function, are normal or not.

The semiconductor memory device disclosed in the filed application is also problematic in that when the data stored in the DQ0 through DQ3 cells 12 through 15 are to be read, since the data are subject to a restoring process based on the parity data depending on the refreshing operation, the stored data cannot directly be read, making it difficult to perform an operation check.

SUMMARY OF THE INVENTION

It is an object of the present invention to provide a semiconductor memory device which is capable of simultaneously reading data and refreshing data and easily performing an operation check.

To achieve the above object, there is provided a semiconductor memory device capable of simultaneously reading data and refreshing data, comprising a data inputting circuit for receiving data inputted from an external circuit, a parity generating circuit for generating parity data from the data input from the data inputting circuit, a memory for storing the data input from the data inputting circuit and the parity data generated by the parity generating circuit, a refreshing circuit for refreshing the memory, a reading circuit for reading the data from the memory, a restoring circuit for restoring data to be refreshed by the refreshing circuit from other data read normally and corresponding parity data, while the reading circuit is reading data, a data outputting circuit for outputting the data read by the reading circuit and the data restored by the restoring circuit, and a parity outputting circuit for directly reading and outputting the parity data stored in the memory. With this arrangement, it is possible to check if parity data is being generated normally or not.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 11 is a diagram illustrative of the principles of operation of a semiconductor memory device disclosed in a filed application;

DESCRIPTION OF THE PREFERRED EMBODIMENTS

Figure 1:
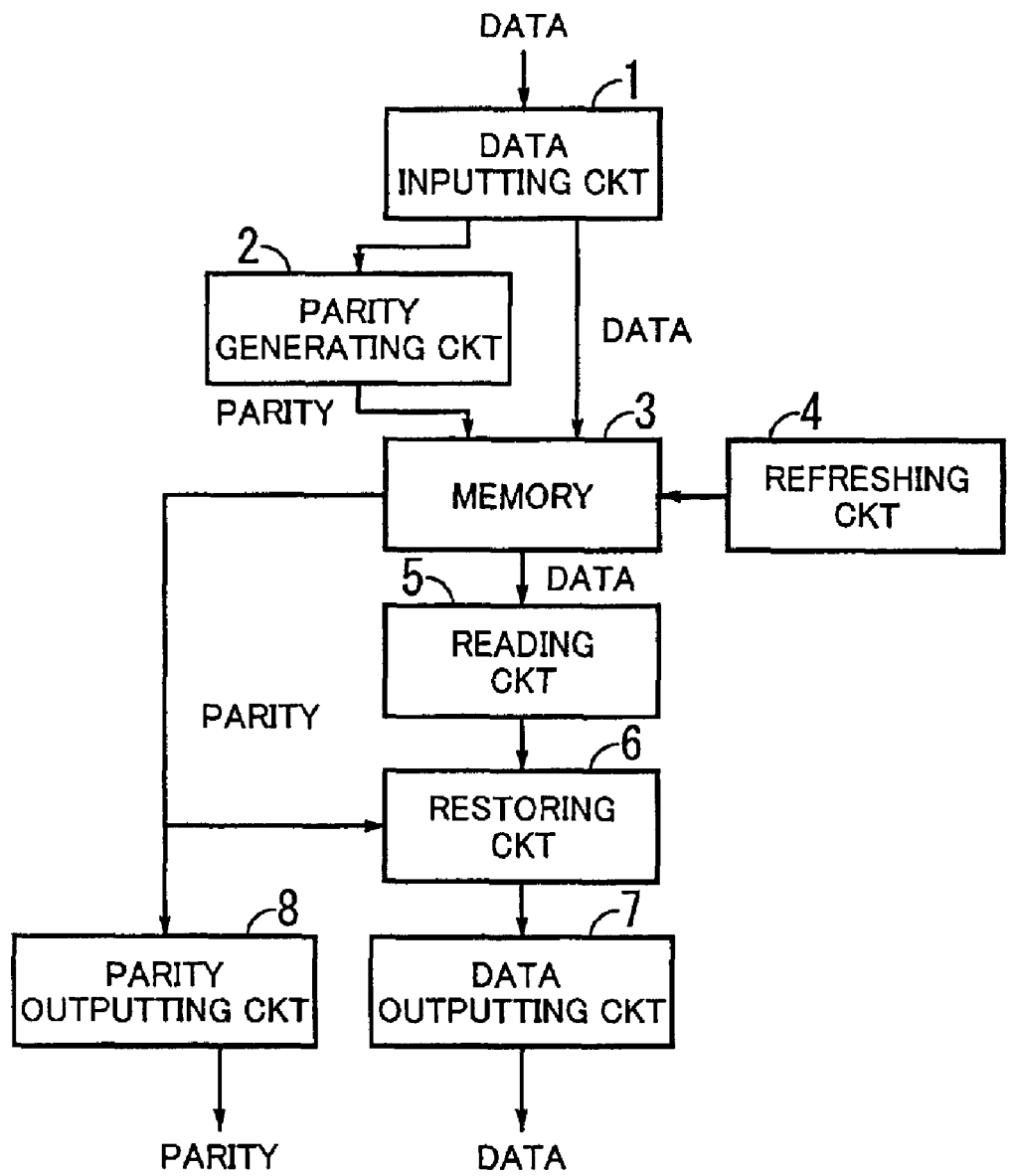
FIG. 1 is a block diagram showing the principles of operation of the present invention.

FIG. 1 shows in block form the principles of operation of the present invention.

In FIG. 1, a data inputting circuit 1 receives data input from an external circuit.

A parity generating circuit 2 generates parity data from the data input from the data inputting circuit 1.

A memory 3 stores the data input from the data inputting circuit 1 and the parity data generated by the parity generating circuit 2.

A refreshing circuit 4 refreshes the memory 3.

A reading circuit 5 reads the data from the memory 3.

A restoring circuit 6 restores data from an area to be refreshed by the refreshing circuit 4 from other data read normally and corresponding parity data, while the reading circuit 5 is reading data.

A data outputting circuit 7 outputs the data read by the reading circuit 5 and the data restored by the restoring circuit 6.

A parity outputting circuit 8 directly reads and outputs the parity data stored in the memory 3.

Operation of the arrangement shown in FIG. 1 will be described below.

The data inputting circuit 1 receives data to be written which are input from outside of a semiconductor memory device, and supplies the received data to the memory 3 and the parity generating circuit 2.

The parity generating circuit 2 XORs all the data input thereto and outputs the exclusive OR as parity data.

The memory 3 stores the data input from the data inputting circuit 1 and the parity data supplied from the parity generating circuit 2, in respective different areas.

The refreshing circuit 4 refreshes the memory 3 at given periods to prevent the stored data from being lost.

The reading circuit 5 reads data stored in a given area of the memory 3 in response to a readout request from outside of the semiconductor memory device, and supplies the read data to the restoring circuit 6.

When reading data from an area of the memory 3 which is to be refreshed by the refreshing circuit 4, the restoring circuit 6 XORs other data read normally and the parity data to determine whether the written data and the read data agree with each other. If the written data and the read data do not agree with each other, then the restoring circuit 6 restores the data by inverting the logic level of the data being refreshed and outputs the restored data.

The data outputting circuit 7 outputs the restored data and the other normal data to a circuit outside of the semiconductor memory device.

The parity outputting circuit 8 directly reads and outputs the parity data stored in the memory in response to a readout request from outside.

The above operation allows the parity data stored in the memory 3 to be read directly, making it possible to check if the parity data is generated normally based on the relationship between the data given to the parity generating circuit 1 and the parity data that is read.

Embodiments of the present invention will be described below.

Figure 2:
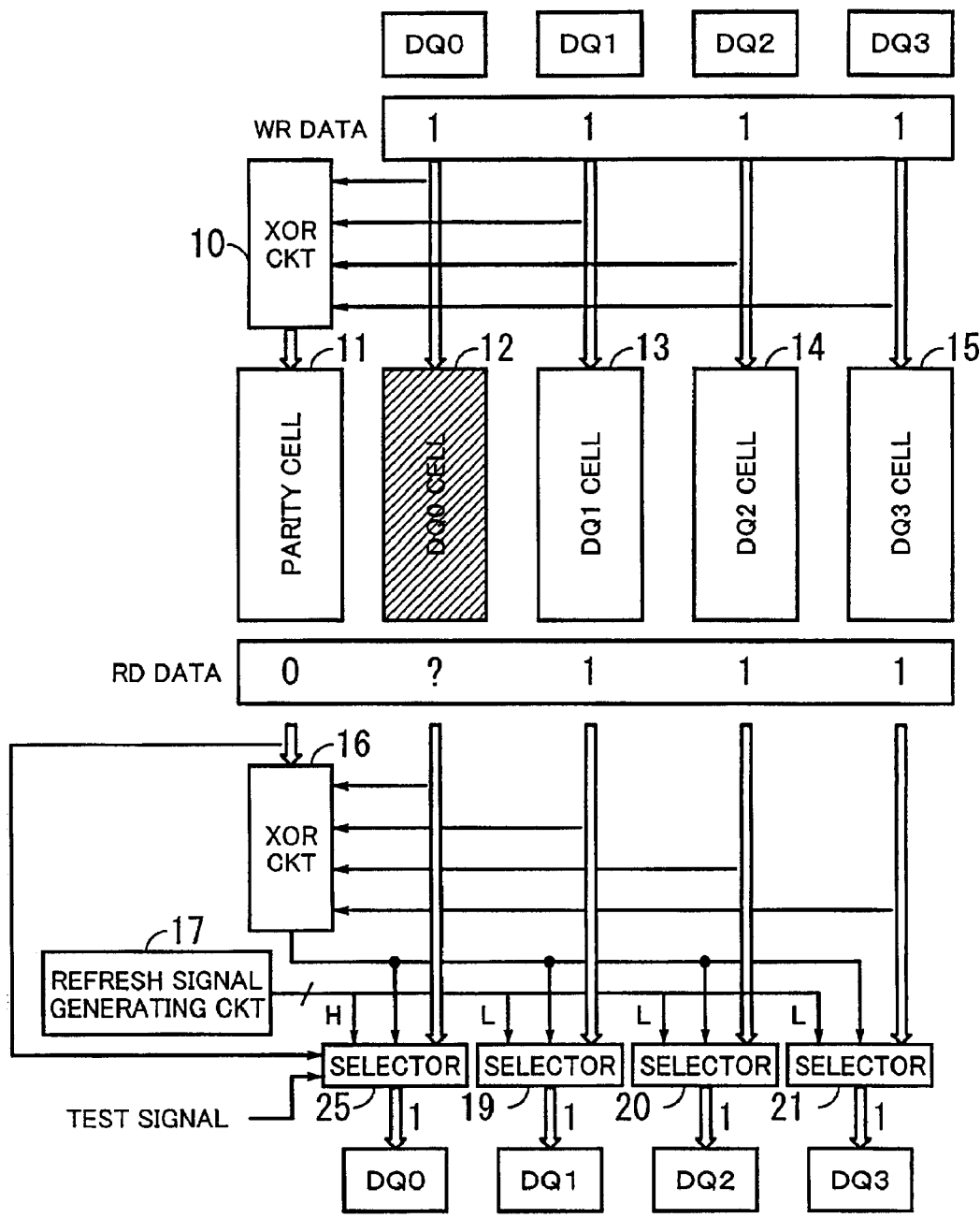
FIG. 2 is a block diagram of a semiconductor memory device according to a first embodiment of the present invention.

FIG. 2 shows in block form a semiconductor memory device according to a first embodiment of the present invention.

As shown in FIG. 2, the semiconductor memory device according to the first embodiment comprises an XOR circuit 10, a parity cell 11, DQ0 through DQ3 cells 12 through 15, an XOR circuit 16, a refresh signal generating circuit 17, and selectors 25, 19 through 21. The semiconductor memory device according to the first embodiment differs from the semiconductor memory device disclosed in the filed application in that the selector 18 of the latter semiconductor memory device is replaced with the selector 25. The other structural details of the semiconductor memory device according to the first embodiment are identical to those of the semiconductor memory device shown in FIG. 15.

The XOR circuit 10 XORs data DQ0 through DQ3 input thereto, and writes the result as parity data in the parity cell 11.

The DQ0 through DQ3 cells 12 through 15 store data input thereto, read data according to a readout request, and supply the read data to the selectors 25, 19 through 21.

The refresh signal generating circuit 17 generates refresh signals and supplies the generated refresh signals to the DQ0 through DQ3 cells 12 through 15 and the selectors 25, 19 through 21. In the illustrated embodiment, the DQ0 cell 12 is shown hatched and is being refreshed. Therefore, only the refresh signal output from the refresh signal generating circuit 17 to the selector 25 is "H" (high in level), and the other refresh signals output from the refresh signal generating circuit 17 to the selectors 19 through 21 are "L" (low in level)

If a test signal is "H", then the selector 25 outputs the parity data from the parity cell 11 regardless of the status of the XOR signal and the refresh signal. If the test signal is "L" and both the output signal from the XOR circuit 16 and the output signal from the refresh signal generating circuit 17 are "H", then the selector 25 selects and outputs a signal which is an inversion of the output signal from the DQ0 cell 12. If the test signal is "L" and both the output signal from the XOR circuit 16 and the output signal from the refresh signal generating circuit 17 are otherwise, then the selector 25 directly outputs the output signal from the DQ0 cell 12.

If both the output signal from the XOR circuit 16 and the output signal from the refresh signal generating circuit 17 are "H", then the selectors 19 through 21 select and output signals which are an inversion of the output signals from the DQ1 through DQ3 cells 13 through 15. Otherwise, the selectors 19 through 21 directly output the output signals from the DQ1 through DQ3 cells 13 through 15.

Figure 3:
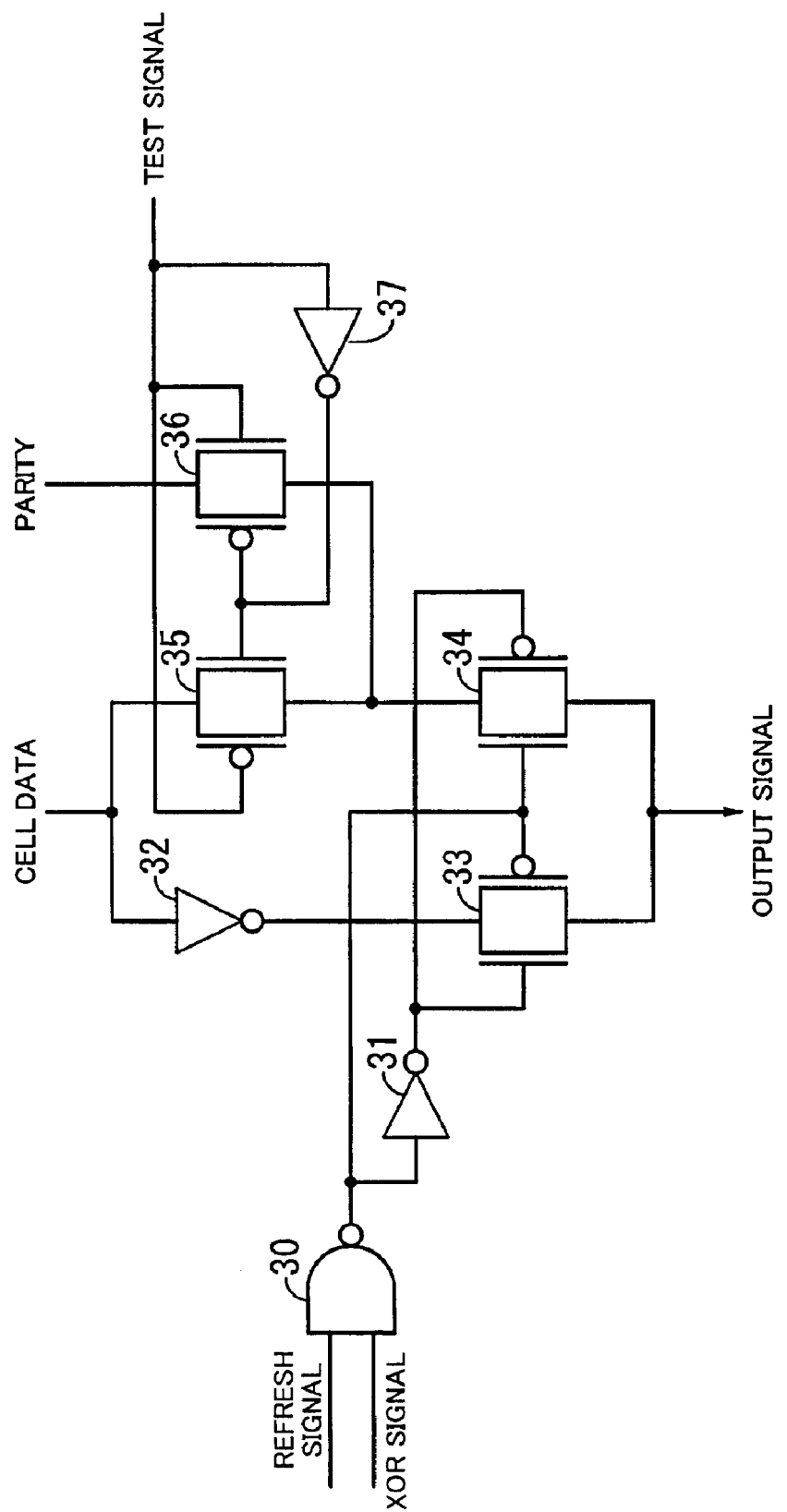
FIG. 3 is a block diagram of a detailed arrangement of a selector shown in FIG. 2.

FIG. 3 is a block diagram of a detailed arrangement of the selector 25.

As shown in FIG. 3, the selector 25 comprises a NAND element 30, inverters 31, 32, 37, and transfer circuits 33 through 36.

The NAND element 30 supplies an inversion of the logical product of the refresh signal which is the output signal from the refresh signal generating circuit 17 and the XOR signal which is the output signal from the XOR circuit 16, to the inverter 31, an inverting input terminal of the transfer circuit 33, and a non-inverting input terminal of the transfer circuit 34.

The inverter 31 supplies the inversion of the output signal from the NAND element 30 to a non-inverting input terminal of the transfer circuit 33 and an inverting input terminal of the transfer circuit 34.

The inverter 32 supplies an inversion of the output signal from the DQ0 cell 12 to the transfer circuit 33.

If the output signal from the NAND element 30 is "L", then the transfer circuit 33 outputs the signal from the inverter 32.

If the output signal from the NAND element 30 is "H", then the transfer circuit 34 directly outputs the output signal from the transfer circuit 35, i.e., the cell data.

The inverter 37 supplies an inversion of the test signal to a non-inverting input terminal of the transfer circuit 35 and an inverting input terminal of the transfer circuit 36.

If the test signal is "L", then the transfer circuit 35 supplies the cell data to the transfer circuit 34.

If the test signal is "H", then the transfer circuit 36 supplies the parity data to the transfer circuit 34.

Operation of the semiconductor memory device according to the first embodiment will be described below.

When the input data DQ0 through DQ3 are supplied, the XOR circuit 10 XORs the supplied data, and supplies the result to the parity cell 11. The parity cell 11 stores the parity data from the XOR circuit 10.

The DQ0 through DQ3 cells 12 through 15 store the input data DQ0 through DQ3, respectively. Since input data DQ0 through DQ3 are all "1" in this embodiment, the DQ0 through DQ3 cells 12 through 15 store "1", and the parity cell 11 stores "0" which is the exclusive OR of input data DQ0 through DQ3.

When there is a request for reading data at this time, the data are read from the DQ0 through DQ3 cells 12 through 15 and the parity cell 11. If the DQ0 cell 12 is to be refreshed at this time, then since the data cannot properly be read from the DQ0 cell 12, any data read therefrom are undefined (?).

The XOR circuit 16 XORs the data read from the DQ0 through DQ3 cells 12 through 15 and the parity data read from the parity cell 11, and supplies the exclusive OR as an XOR signal to the selectors 25, 19 through 21. The XOR signal is "H" if the data written in the DQ0 through DQ3 cells 12 through 15 and the data read from the DQ0 through DQ3 cells 12 through 15 do no agree with each other, and is "L" otherwise. Therefore, the XOR signal which is "H" represents an error.

In this embodiment, the data DQ0 is undefined. If the data DQ0 is "1", then the data written in the DQ0 through DQ3 cells 12 through 15 and the data read from the DQ0 through DQ3 cells 12 through 15 agree with each other, and hence the XOR signal is "L". If the data DQ0 is "0", then the data written in the DQ0 through DQ3 cells 12 through 15 and the data read from the DQ0 through DQ3 cells 12 through 15 do not agree with each other, and hence the XOR signal is "H".

If the test signal is "L", since the transfer circuit 35 is turned ON and the transfer circuit 36 is turned OFF. Therefore, the selector operates in substantially the same manner as the circuit shown in FIG. 16. If the XOR signal is "H" at this time, representing that the read data is erroneous, then since the signal supplied from the refresh signal generating circuit 17 to the selector 25 is "H", the output signal from the NAND element 30 is "L". As a result, the transfer circuit 33 is turned ON, outputting a signal "1" which is an inversion of the input DQ0 which is "0". Because the output signal "1" is the same as the input DQ0, the data is properly restored.

If the output signal from the DQ0 cell 12 is "1", then since the XOR signal is "L", the output signal from the NAND circuit 30 is "H". As a result, the transfer circuit 34 is turned ON, directly outputting the input DQ0.

Since the output signals supplied from the refresh signal generating circuit 17 to the selectors 19 through 21 are "L", the output signals from the NAND elements 30 of the respective selectors 19 through 21 are "H", turning ON the transfer circuit 34. The transfer circuit 34 thus directly outputs the data read from the DQ1 through DQ3 cells 13 through 15.

If the test signal is "H", since the transfer circuit 36 is turned ON and the transfer circuit 35 is turned OFF. Therefore, the parity data is supplied to the transfer circuit 34.

Unless the DQ0 cell 12 is to be refreshed and the read data is erroneous, the transfer circuit 34 is turned ON, and hence outputs the parity data.

In the present embodiment, it is possible to directly read the parity data stored in the parity cell 11 by making the test signal "H". If the input data DQ0 through DQ3 are changed, for example, it becomes possible to determine whether parity data is generated normally.

Since the parity data is output from a terminal (not shown) for outputting the DQ0 data, it is not necessary to provide a new terminal for outputting the parity data. Consequently, the semiconductor memory device can have a checking function without the need for an increased number of terminals.

In the above embodiment, the output signal from the inverter 37 may be supplied to an input terminal of the NAND element 30. In such an arrangement, if the test signal is "H", then it is possible to obtain parity data at all times regardless of the refreshed and read status.

A second embodiment of the present invention will be described below.

Figure 4:
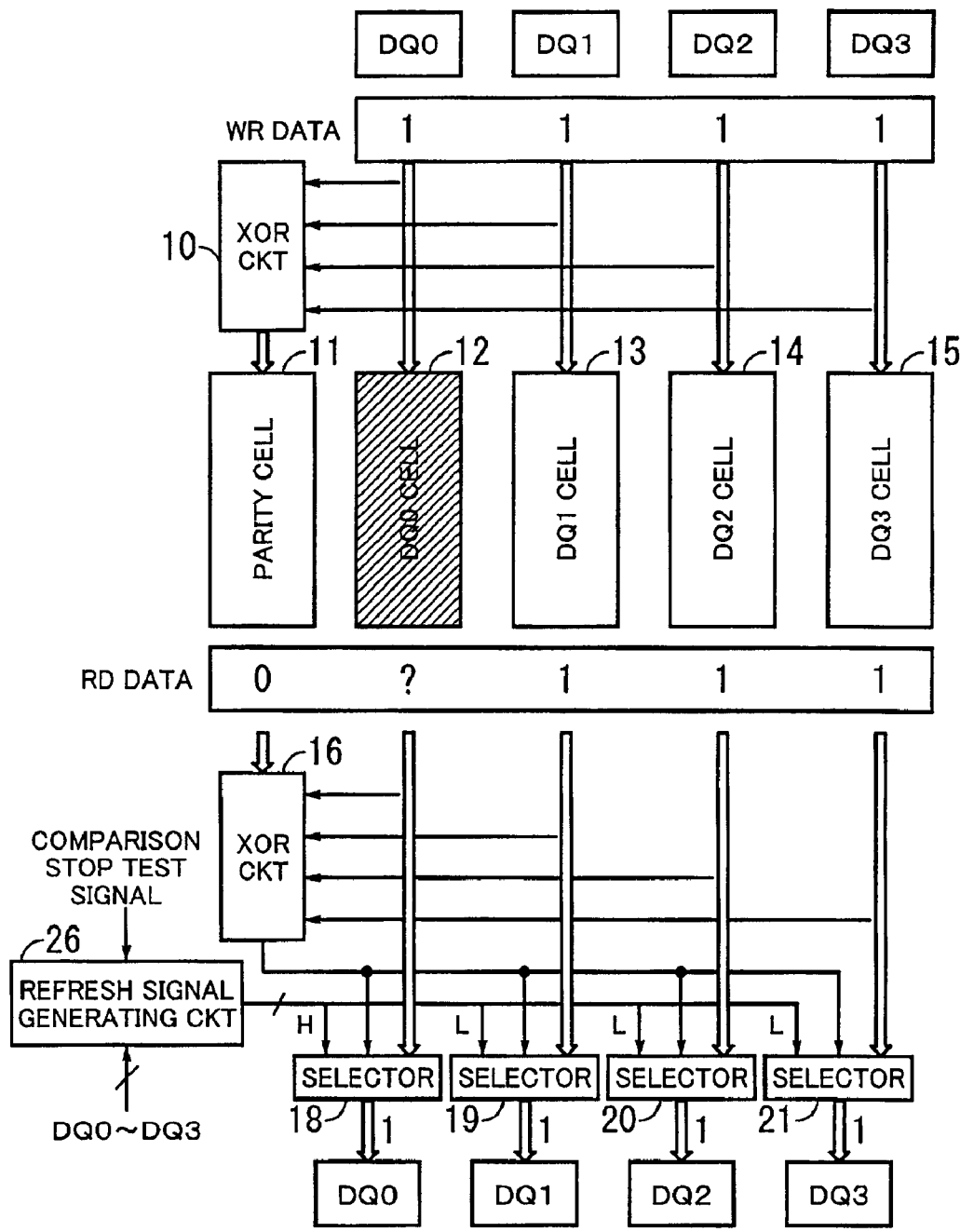
FIG. 4 is a block diagram of a semiconductor memory device according to a second embodiment of the present invention.

FIG. 4 shows in block form a semiconductor memory device according to a second embodiment of the present invention. Those parts of the semiconductor memory device shown in FIG. 4 which are identical to those shown in FIG. 15 are denoted by identical reference characters, and will not be described in detail below.

Figure 15:
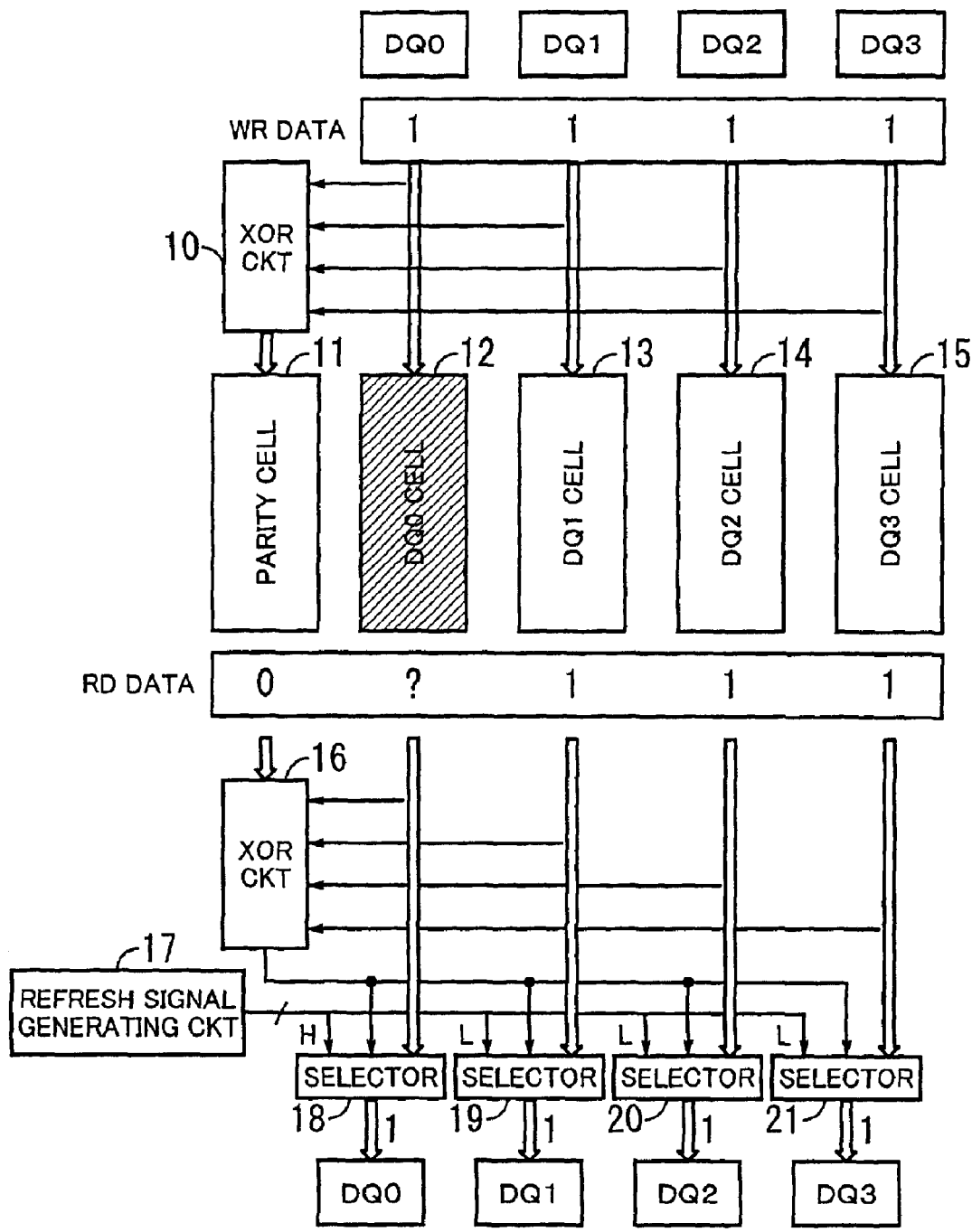
FIG. 15 is a block diagram of a detailed arrangement of the semiconductor memory device disclosed in the filed application.

The semiconductor memory device according to the second embodiment differs from the semiconductor memory device shown in FIG. 15 in that the refresh signal generating circuit 17 of the latter semiconductor memory device is replaced with a refresh signal generating circuit 26. The other structural details of the semiconductor memory device according to the second embodiment are identical to those of the semiconductor memory device shown in FIG. 15.

The refresh signal generating circuit 26 generates and supply refresh signals to the DQ0 through DQ3 cells 12 through 15 and the selectors 18 through 21, and refreshes a specified cell when supplied with a comparison stop signal and parity check test signals DQ0 through DQ3 from an external circuit.

Figure 5:
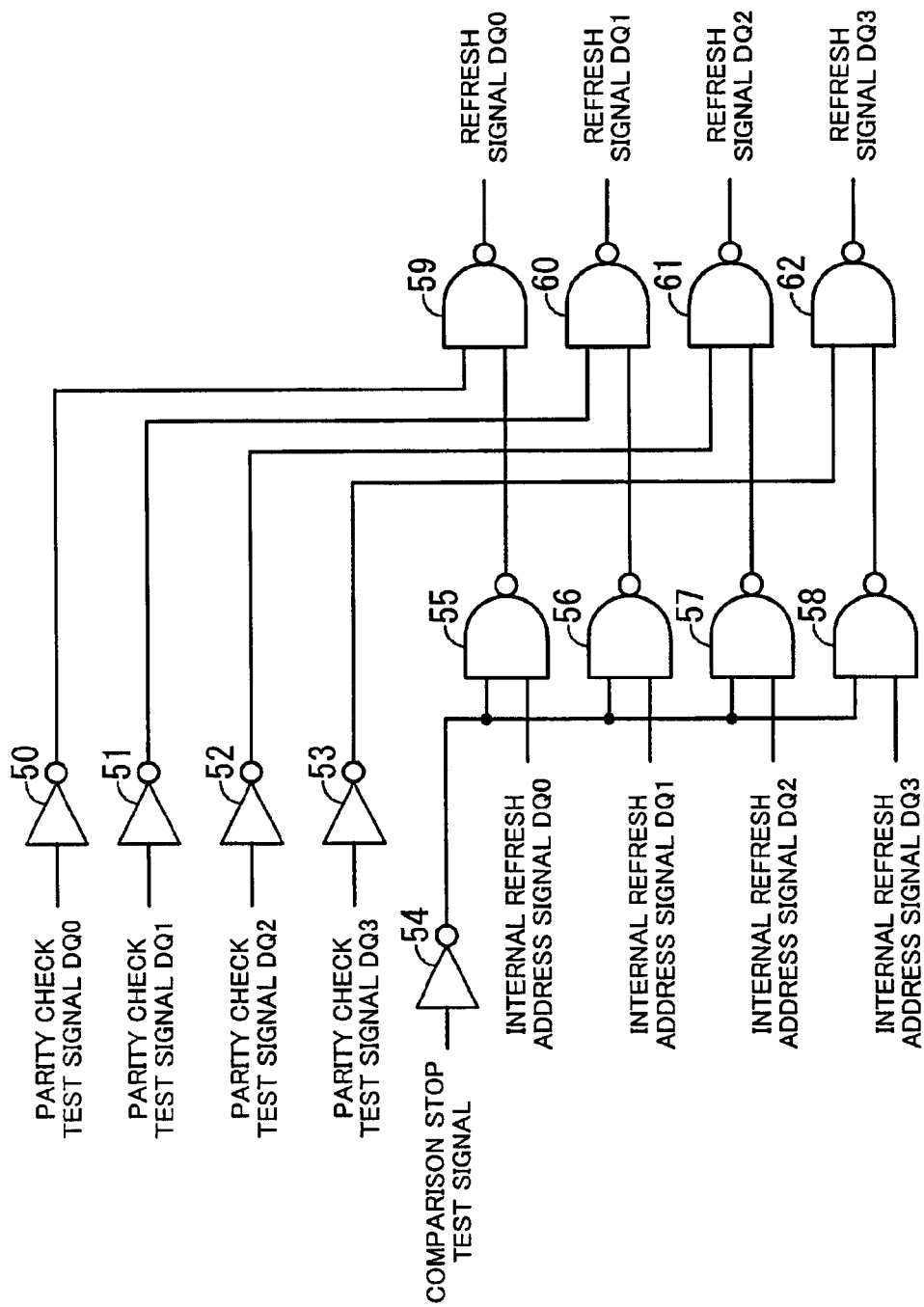
FIG. 5 is a block diagram of a detailed arrangement of a refresh signal generating circuit shown in FIG. 4.

FIG. 5 shows in block form a detailed arrangement of the refresh signal generating circuit 26. As shown in FIG. 5, the refresh signal generating circuit 26 comprises inverters 50 through 54 and NAND elements 55 through 62.

The inverters 50 through 53 invert and output parity check test signals DQ0 through DQ3 which are from an external circuit to refresh certain cells.

The inverter 54 inverts and outputs a comparison stop test signal for invalidating internal refresh signals.

The NAND elements 55 through 58 output inversions of the logical products of the comparison stop test signal and internal refresh address signals DQ0 through DQ3 to the respective NAND elements 59 through 62.

The NAND elements 59 through 62 output inversions of the logical products of the output signals from the inverters 50 through 53 and the output signals from the NAND elements 55 through 58, as refresh signals DQ0 through DQ3.

Operation of the semiconductor memory device according to the second embodiment will be described below.

A process of checking the DQ0 cell 12 will be described below. To check the DQ0 cell 12, the comparison stop test signal is made "H", and the parity check test signal DQ0 is made "H".

Since the output signal from the inverter 54 shown in FIG. 5 becomes "L", the signals supplied to one input terminals of the NAND elements 55 through 58 become "L", making "H" the output signals from the NAND elements 55 through 58 regardless of the status of the internal refresh address signals DQ0 through DQ3. The internal refresh address signals DQ0 through DQ3 refer to refresh signals that are generated internally.

When the output signals from the NAND elements 55 through 58 become "H", the signals supplied to one input terminals of the NAND elements 59 through 62 become "H", and the NAND elements 59 through 62 output signals that are "H" or "L" depending on the output signals from the inverters 50 through 53.

In the present embodiment, since only the parity check test signal DQ0 is "H", only the output signal from the inverter 50 is "L" and the output signals from the other inverters 51 through 53 are "H".

Consequently, only the output signal from the NAND element 59 is "H", and the output signals from the other NAND elements 60 through 62 are "L". As a result, the DQ0 cell 12 is to be refreshed.

By thus specifying a cell to be refreshed, it is possible to check individually whether the restoring function relative to the cell is operating normally or not. It thus becomes possible to easily detect a fault that occurs less frequently by repeatedly checking a cell that is not functioning normally.

A third embodiment of the present invention will be described below.

Figure 6:
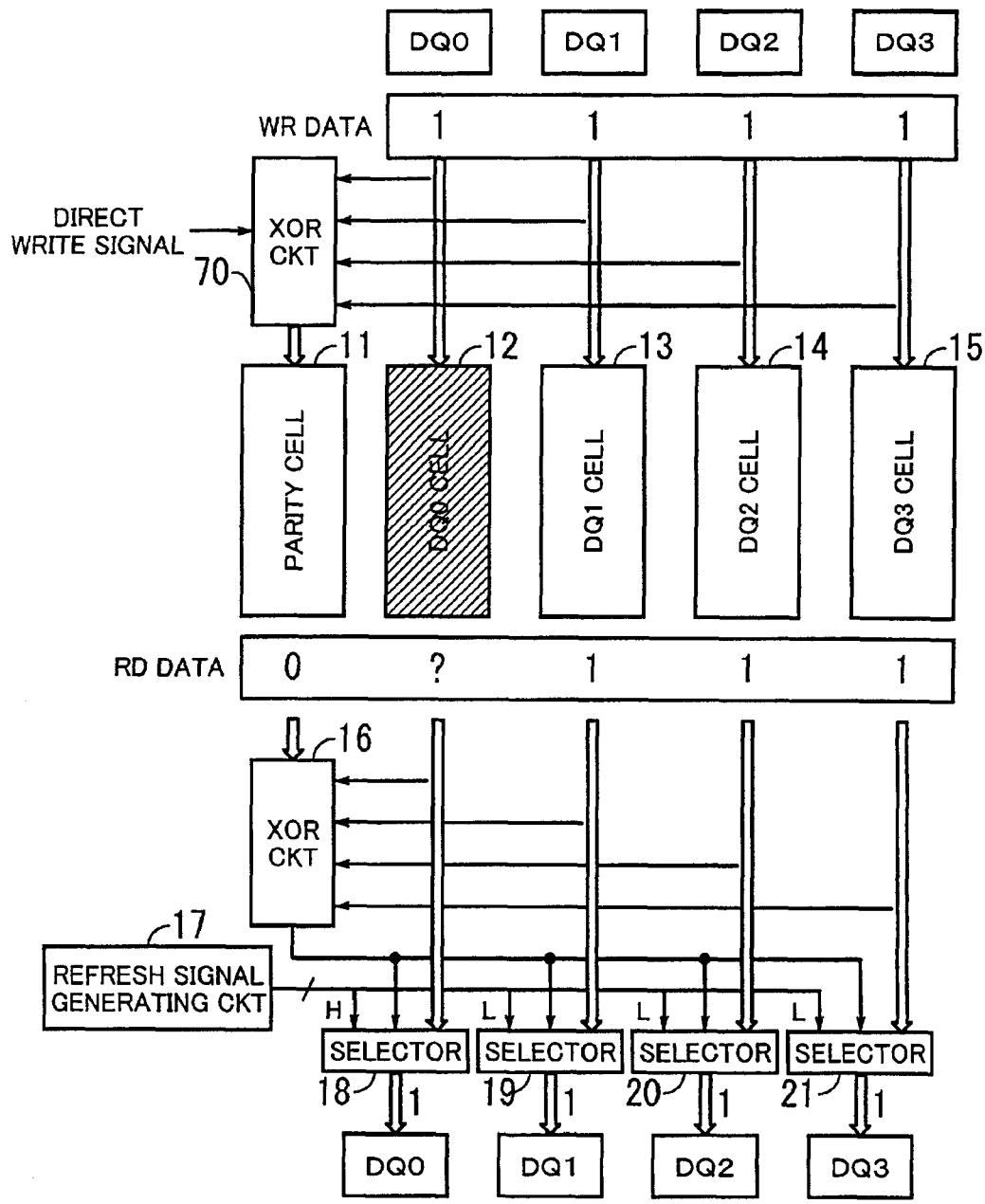
FIG. 6 is a block diagram of a semiconductor memory device according to a third embodiment of the present invention.

FIG. 6 shows in block form a semiconductor memory device according to a third embodiment of the present invention. Those parts of the semiconductor memory device shown in FIG. 6 which are identical to those shown in FIG. 15 are denoted by identical reference characters, and will not be described in detail below.

The semiconductor memory device according to the third embodiment differs from the semiconductor memory device shown in FIG. 15 in that the XOR circuit 10 of the latter semiconductor memory device is replaced with an XOR circuit 70. The other structural details of the semiconductor memory device according to the third embodiment are identical to those of the semiconductor memory device shown in FIG. 15.

As with the XOR circuit 10, the XOR circuit 70 XORs data DQ0 through DQ3 input thereto. If a direct write signal input from an external circuit becomes "H", then the XOR circuit 70 directly writes data DQ0 into the parity cell 11.

Figure 7:
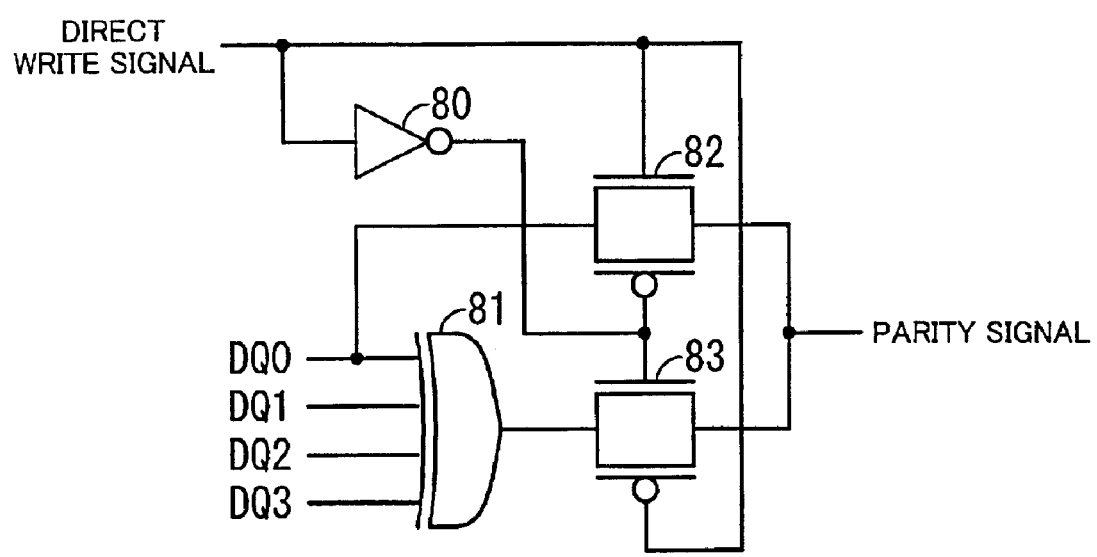
FIG. 7 is a block diagram of a detailed arrangement of an XOR circuit shown in FIG. 6.

FIG. 7 shows in block form a detailed arrangement of the XOR circuit 70. As shown in FIG. 7, the XOR circuit 70 comprises an inverter 80, an XOR (exclusive OR) element 81, and transfer circuits 82, 83.

The inverter 80 inverts a direct write signal and supplies the inverted direct write signal to an inverting input terminal of the transfer circuit 82 and a non-inverting input terminal of the transfer circuit 83.

The XOR element 81 XORs data DQ0 through DQ3, and supplies the result to the transfer circuit 83.

If the direct write signal is "H", then the transfer circuit 82 supplies the data DQ0 as parity data to the parity cell 11.

If the direct write signal is "L", then the transfer circuit 83 supplies the output signal from the XOR element 81 as a parity signal to the parity cell 11.

Operation of the semiconductor memory device according to the third embodiment will be described below.

A process of writing normal parity data will first be described below. After all the data DQ0 through DQ3 are written as "1", the direct write signal is made "H", and "0" is input as the signal DQ0. At this time, the transfer circuit 82 shown in FIG. 7 is turned ON. As a result, the signal DQ0 which is "0" is written as a parity signal in the parity cell 11.

A process of reading written data while the DQ0 cell 12 is being refreshed will be described below. "0" is read from the parity cell 11, and "1" is read from all the DQ1 through DQ3 cells 13 through 15. No data is specified which is read from the DQ0 cell 12. However, if "0" is read from the DQ0 cell 12, then these read data are supplied to the XOR circuit 16 and the selectors 18 through 21.

The XOR circuit 16 XORs the parity data and the data DQ0 through DQ3, and supplies the result to the selectors 18 through 21. In this embodiment, DQ0 is "0", DQ1 through DQ3 are "1", and the parity data is "0". Therefore, the output signal from the XOR circuit 16 is "1".

The refresh signal generating circuit 17 makes "H" only the refresh signal supplied to the selector 18, and makes "L" the other refresh signals supplied to the selectors 19 through 21. Therefore, the selectors 19 through 21 directly output the read data "1".

Figure 16:
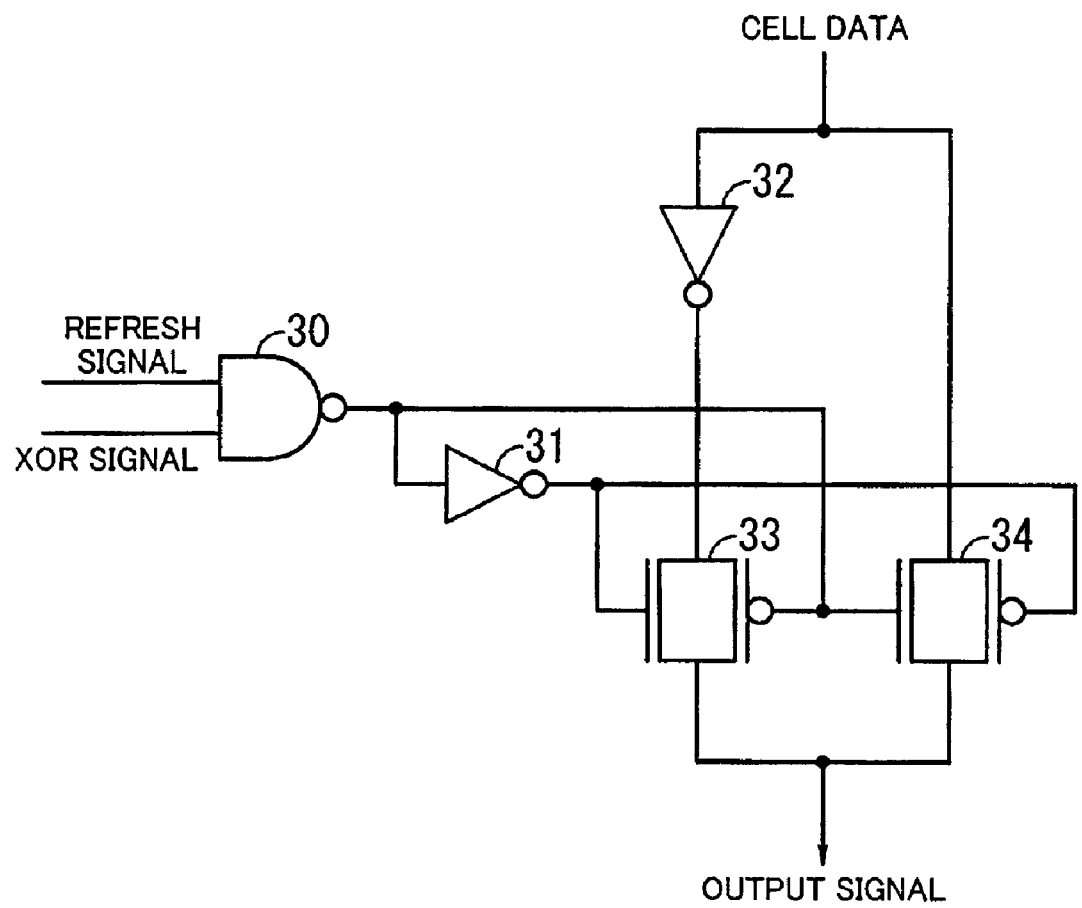
FIG. 16 is a block diagram of a detailed arrangement of a selector shown in FIG. 15.

In the selector 18 shown in FIG. 16, the signal inverted by the inverter 32 is output via the transfer circuit 33. Therefore, the read data "0" is finally restored to original data "1" and output.

A process of writing parity data which is not normal will be described below. After all the data DQ0 through DQ3 are written as "1", the direct write signal is supplied, and "1" is input as the data DQ0. At this time, the transfer circuit 82 shown in FIG. 7 is turned ON, writing the data DQ0 which is "1" as parity data in the parity cell 11.

A process of reading written data while the DQ0 cell 12 is being refreshed will be described below. "1" is read from the parity cell 11, and "1" is read from all the DQ1 through DQ3 cells 13 through 15. No data is specified which is read from the DQ0 cell 12. However, if "0" is read from the DQ0 cell 12, then these read data are supplied to the XOR circuit 16 and the selectors 18 through 21.

The XOR circuit 16 XORS the parity data and the data DQ0 through DQ3, and supplies the result to the selectors 18 through 21. In this embodiment, DQ0 is "0", DQ1 through DQ3 are "1", and the parity data is "1". Therefore, the output signal from the XOR circuit 16 is "1".

The refresh signal generating circuit 17 makes "H" only the refresh signal supplied to the selector 18, and makes "L" the other refresh signals supplied to the selectors 19 through 21. Therefore, the selectors 19 through 21 directly output the read data "1".

In the selector 18, the output signal from the NAND element 30 shown in FIG. 3 becomes "L". Therefore, the data "0" read from the DQ0 cell 12 is output via the transfer circuit 33.

As a consequence, only the data of a cell which is being refreshed is inverted and output. Therefore, if it is confirmed that inverted data are outputted from all the cells, then it is possible to confirm that the restoring function relative to all the cells is operating normally.

Operation checks are performed respectively for the writing of normal parity data and the writing of parity data which is not normal. This makes the number of check patterns greater than if checks are performed without changing parity data, making it possible to check in detail whether the restoring function is operating normally or not.

Checking processes for the embodiments used singly and in combination will be described below.

First, a checking operation for the first embodiment used singly will be described below.

Figure 8:
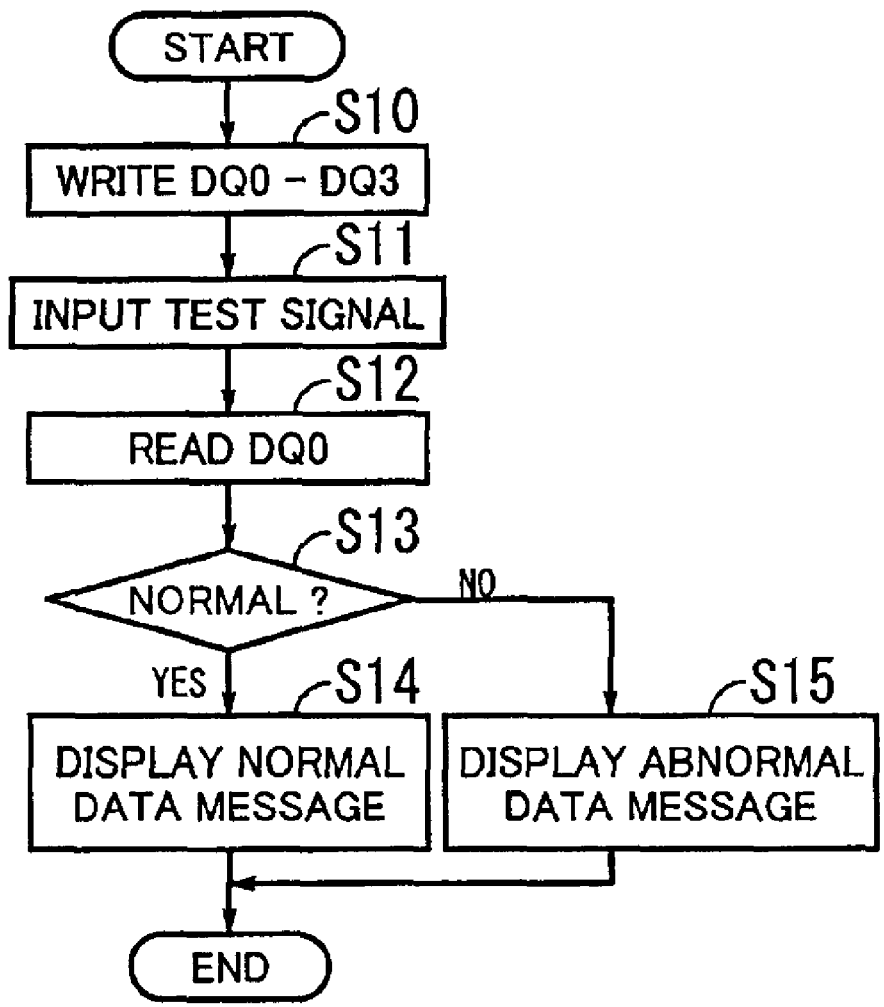
FIG. 8 is a flowchart of a processing sequence of a checking operation performed when the semiconductor memory device according to the first embodiment is used alone.

FIG. 8 is a flowchart of a processing sequence of a checking operation performed when the semiconductor memory device according to the first embodiment is used alone. The processing sequence gives input data DQ0 through DQ3 normally to generate parity data, and directly reads and verifies the parity data written in the parity cell 11. When the processing sequence is started, the following steps are carried out:

Step S10:

Input data DQ0 through DQ3 are written in the semiconductor memory device. As a result, the input data DQ0 through DQ3 are written respectively in the DQ0 through DQ3 cells 12 through 15, and parity data supplied from the XOR circuit 10 is written in the parity cell 11.

Step S11:

A test signal is input to the semiconductor memory device. As a result, the transfer circuit 36 is turned ON, allowing the parity data to be directly output.

Step S12:

Data DQ0 is read from the semiconductor memory device.

Step S13:

It is determined whether the data DQ0 which is read from the semiconductor memory device, i.e., the parity data, is normal or not. Since the read parity data should be equal to the exclusive OR of the input data DQ0 through DQ3, it is determined whether the exclusive OR of the input data DQ0 through DQ3 and the read parity data are equal to each other or not. If the exclusive OR of the input data DQ0 through DQ3 and the read parity data are equal to each other, then the parity data is judged as being normal, and control goes to STEP S14. Otherwise, control goes to STEP S15.

Step S14:

A message indicating that the read parity data is normal is displayed on a display device, not shown.

Step S15:

A message indicating that the read parity data is abnormal is displayed on the display device, not shown.

In the above process, the input data DQ0 through DQ3 are input to the semiconductor memory device in a normal mode of operation to generate parity data, and a test signal is supplied to directly read and verify the parity data stored in the parity cell 11.

A third embodiment of the present invention which is a combination of the first and second embodiments will be described below. In the first embodiment, it is possible to directly read the parity data from the parity cell 11. In the second embodiment, desired data can directly be written in the parity cell 11. These features are combined with each other to write desired data in the parity cell 11 and directly read the data written in the parity cell 11 for thereby making it possible to determine whether the parity cell 11 is operating normally or not.

Figure 9:
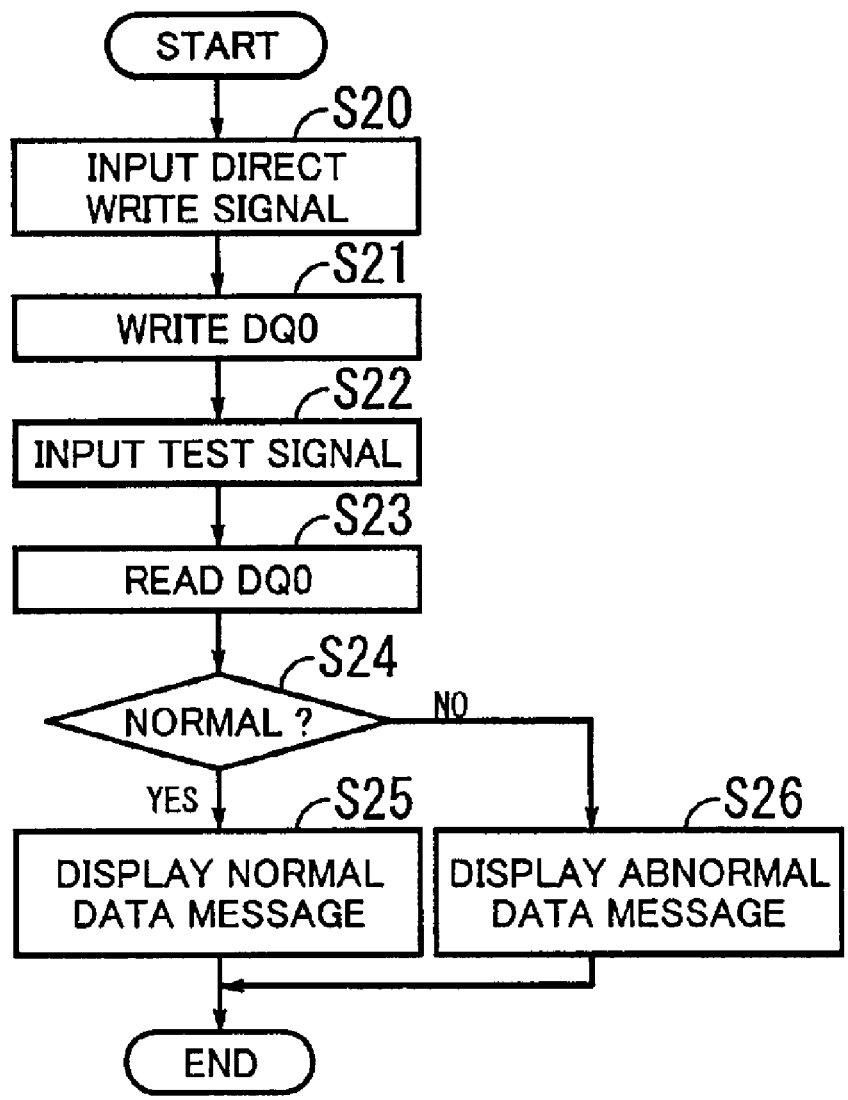
FIG. 9 is a flowchart of an operation sequence of the semiconductor memory device according to the third embodiment which is a combination of the semiconductor memory devices according to the first and second embodiments.

FIG. 9 is a flowchart of an operation sequence of the semiconductor memory device according to the third embodiment which is a combination of the semiconductor memory devices according to the first and second embodiments.

When the processing sequence is started, the following steps are carried out:

Step S20:

A direct write signal is input to the semiconductor memory device. As a result, the transfer circuit 82 shown in FIG. 7 is turned ON, directly writing input data DQ0 in the parity data 11.

Step S21:

Desired data DQ0 is written in the semiconductor memory device. Since the transfer circuit 82 has been turned ON by the direct write signal as a result of STEP S20, the desired data DQ0 is directly written in the parity cell 11.

Step S22:

A test signal is input to the semiconductor memory device. As a result, the transfer circuit 36 shown in FIG. 3 is turned ON, allowing the parity data to be directly read from the DQ0 terminal to the external circuit.

Step S23:

The data DQ0 is read from the semiconductor memory device. As a result, the parity data can directly be read from the parity cell 11 via the transfer circuit 36.

Step S24:

It is determined whether the parity data read from the semiconductor memory device and the written parity data (DQ0) are equal to each other. If the parity data read from the semiconductor memory device and the written parity data (DQ0) are equal to each other, then control goes to STEP S25. Otherwise, control goes to STEP S26.

Step S25:

A message indicating that the read parity data is normal is displayed on a display device, not shown.

Step S26:

A message indicating that the read parity data is abnormal is displayed on the display device, not shown.

In the above process, it is possible to directly write data in the parity cell 11 and also to directly read the parity data and verify whether the read and written data is normal or not.

An inspecting process according to a fourth embodiment of the present invention which is a combination of the second and third embodiments will be described below. In the second embodiment, a cell to be refreshed can be selected. In the third embodiment, data can directly be written in the parity cell 11. The combination of these features allows desired data to be written in the parity cell 11 and also allows a desired cell to be specified as a cell to be refreshed for thereby checking if the data restoring function is operating normally for each cell or not.

Figure 10:
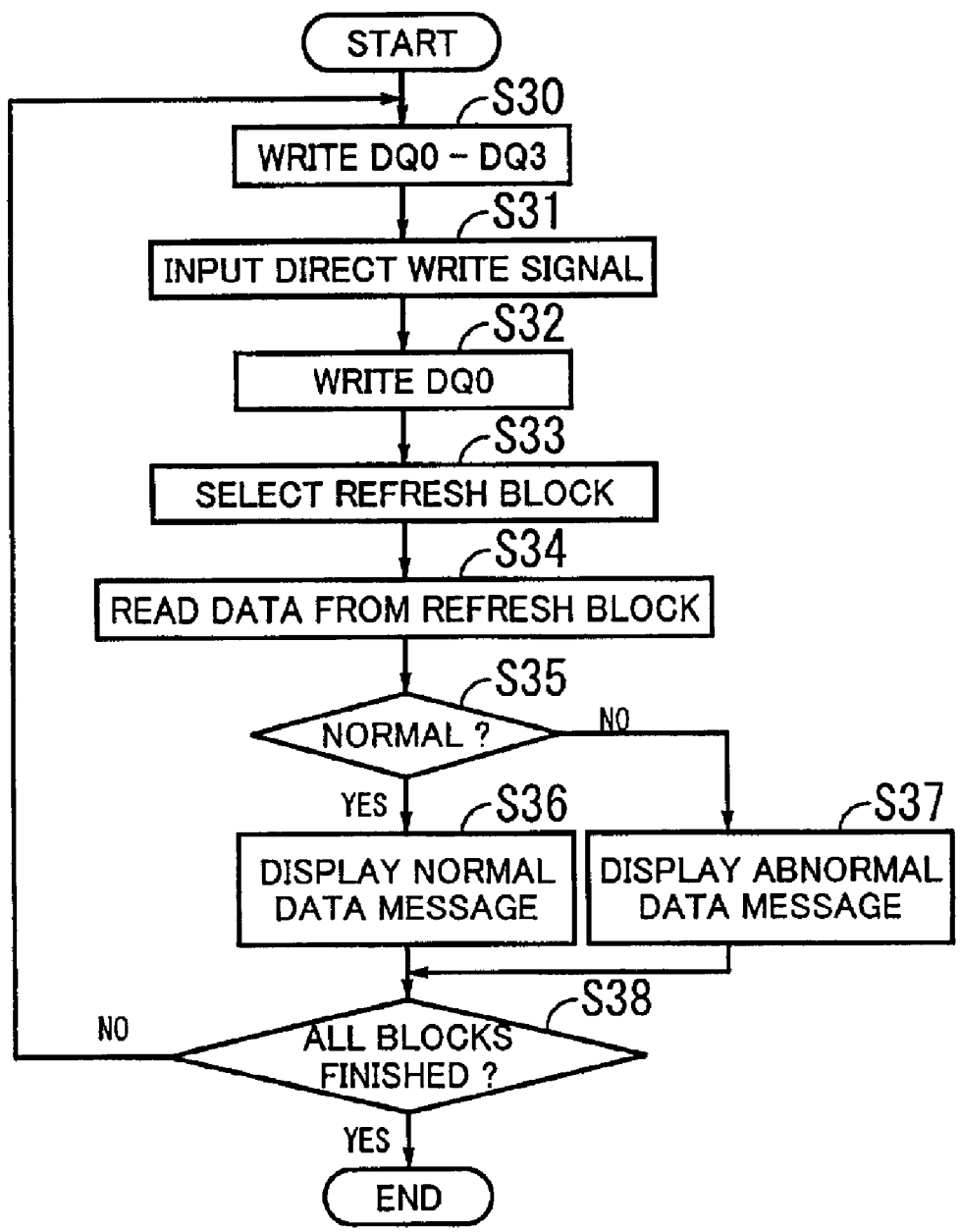
FIG. 10 is a flowchart of an operation sequence of a semiconductor memory device according to a fifth embodiment which is a combination of the semiconductor memory device according to the third embodiment and a semiconductor memory device according to a fourth embodiment.
Figure 12:
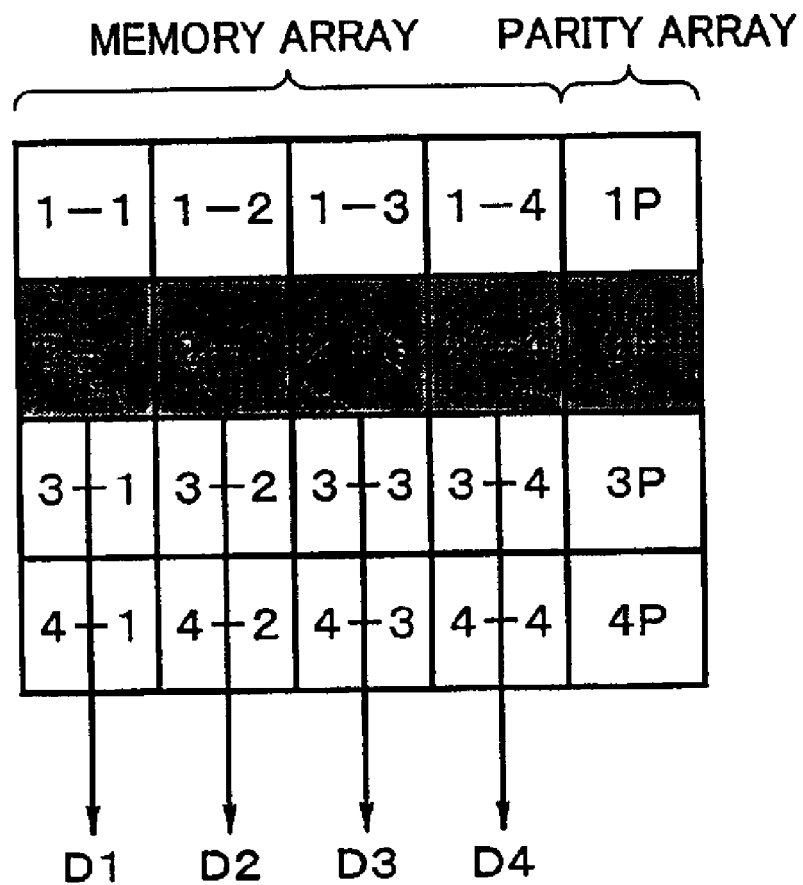
FIG. 12 is a diagram illustrative of the manner in which data are read from a memory array of the semiconductor memory device disclosed in the filed application.
Figure 13:
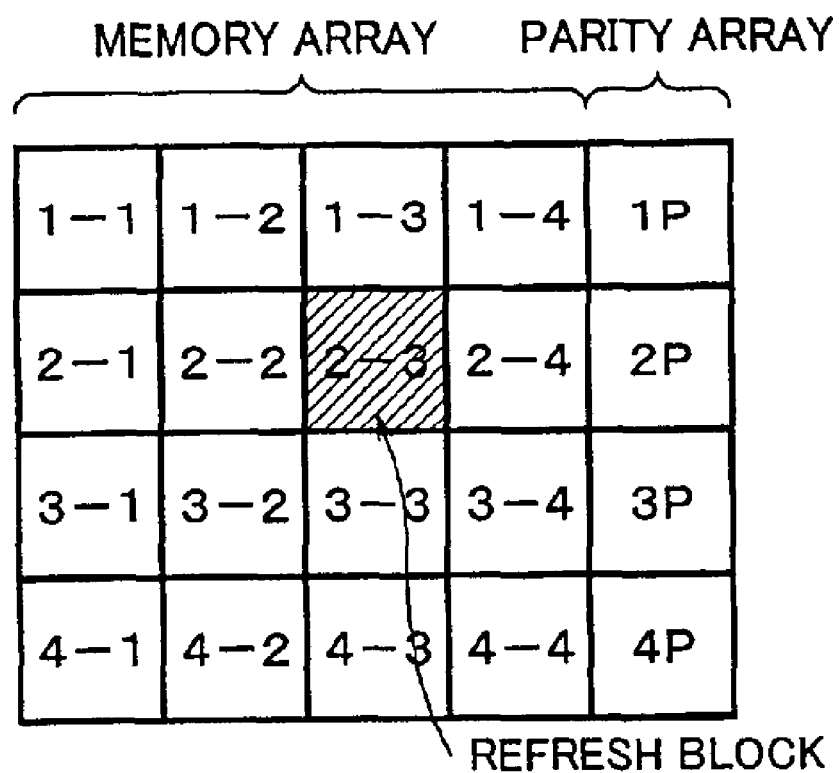
FIG. 13 is a diagram illustrative of the manner in which memory cells are refreshed in the semiconductor memory device disclosed in the filed application.
Figure 14:
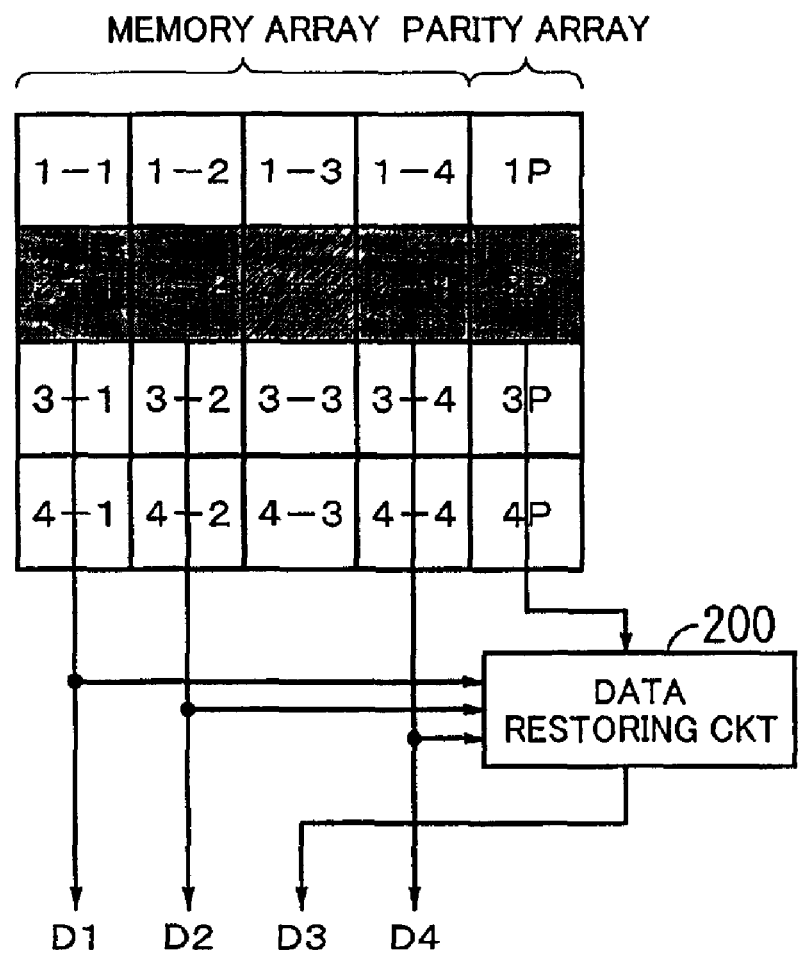
FIG. 14 is a diagram illustrative of the manner in which subblocks are refreshed and data are read concurrently, with subblocks to be refreshed and subblocks to read data from overlapping each other in the semiconductor memory device disclosed in the filed application.

FIG. 10 is a flowchart of an operation sequence of a semiconductor memory device according to a fifth embodiment which is a combination of the semiconductor memory device according to the third embodiment and the semiconductor memory device according to the fourth embodiment. When the processing sequence is started, the following steps are carried out:

Step S30:
Desired data DQ0 through DQ3 are written in the semiconductor memory device.

Step S31:
A direct write signal is input to the semiconductor memory device. As a result, the transfer circuit 82 shown in FIG. 7 is turned ON, directly supplying input data DQ0 to the parity data 11.

Step S32:
Desired data DQ0 is written in the semiconductor memory device. The data DQ0 is directly written in the parity cell 11 via the transfer circuit 82.

Step S33:
A comparison stop test signal is supplied to the semiconductor memory device, and a parity check signal is input thereto to select a desired cell as a cell to be refreshed. For example, if the DQ0 cell 12 is to be refreshed, then the comparison stop test signal is input to the semiconductor memory device, and a parity check test signal DQ0 is supplied thereto. As a result, all the output signals from the NAND elements 55 through 58 become "H", and the NAND element 59 outputs a refresh signal depending on the parity check test signal DQ0.

Step S34:
Data from the block selected to be refreshed in STEP S33 is read from the semiconductor memory device. In this example, since the DQ0 cell 12 is selected as a cell to be refreshed, the data DQ0 is read therefrom.

Step S35:
Data of the block selected to be refreshed is read from the semiconductor memory device, and it is determined whether the read data is normal or not. Specifically, it is determined whether the read data is normal or not based on the relationship between the data DQ0 through DQ3 input in STEP S30 and the parity data written in STEP S32. If the read data is normal, then control goes to STEP S36. Otherwise, control goes to STEP S37.

Step S36:
A message indicating that the read parity data is normal is displayed on a display device, not shown.

Step S37:
A message indicating that the read parity data is abnormal is displayed on the display device, not shown.

Step S38:
It is determined whether the check of all the blocks is finished or not. If not finished, then control goes back to STEP S30 to repeat the above process. Otherwise, the process is put to an end.

In the above process, since parity data is directly written in the parity cell, and a cell to be refreshed is selected. Therefore it is possible to verify whether the data storing function relative to a selected cell is operating normally or not.

The circuits shown and described above are given by way of example only, and the present invention is not limited to the illustrated circuits.

A semiconductor memory device capable of simultaneously reading data and refreshing data according to the present invention comprises a data inputting circuit for receiving data inputted from an external circuit, a parity generating circuit for generating parity data from the data input from the data inputting circuit, a memory for storing the data input from the data inputting circuit and the parity data generated by the parity generating circuit, a refreshing circuit for refreshing the memory, a reading circuit for reading the data from the memory, a restoring circuit for restoring data to be refreshed by the refreshing circuit from other data read normally and corresponding parity data, while the reading circuit is reading data, a data outputting circuit for outputting the data read by the reading circuit and the data restored by the restoring circuit, and a parity outputting circuit for directly reading and outputting the parity data stored in the memory. With this arrangement, it is possible to check if parity data is being generated normally or not.

Another semiconductor memory device capable of simultaneously reading data and refreshing data according to the present invention comprises a data inputting circuit for receiving data inputted from an external circuit, a parity generating circuit for generating parity data from the data input from the data inputting circuit, a memory for storing the data input from the data inputting circuit and the parity data generated by the parity generating circuit, a refreshing circuit for refreshing the memory, a reading circuit for reading the data from the memory, a restoring circuit for restoring data to be refreshed by the refreshing circuit from other data read normally and corresponding parity data, while the reading circuit is reading data, a data outputting circuit for outputting the data read by the reading circuit and the data restored by the restoring circuit, and a writing circuit for directly writing desired data supplied from an external circuit in an area of the memory where the parity data is stored. With this arrangement, it is possible to establish desired parity data and check if a data restoring function is operating normally or not.

Still another semiconductor memory device capable of simultaneously reading data and refreshing data according to the present invention comprises a data inputting circuit for receiving data inputted from an external circuit, a parity generating circuit for generating parity data from the data input from the data inputting circuit, a memory for storing the data input from the data inputting circuit and the parity data generated by the parity generating circuit, a refreshing circuit for refreshing the memory, a reading circuit for reading the data from the memory, a restoring circuit for restoring data to be refreshed by the refreshing circuit from other data read normally and corresponding parity data, while the reading circuit is reading data, a data outputting circuit for outputting the data read by the reading circuit and the data restored by the restoring circuit, and a control circuit for controlling the refreshing circuit to refresh a given area according to a request from an external circuit. With this arrangement, it is possible to select an area to be refreshed for thereby checking if a data restoring function for the selected area is operating normally or not.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory device capable of simultaneously reading data and refreshing data, comprising:
   a data inputting circuit for receiving data inputted from an external circuit;
   a parity generating circuit for generating parity data from the data input from said data inputting circuit;

a memory for storing the data input from said data inputting circuit and the parity data generated by said parity generating circuit;

a refreshing circuit for refreshing said memory;

a reading circuit for reading the data from said memory;

a restoring circuit for restoring data to be refreshed by said refreshing circuit from other data read normally and corresponding parity data, while said reading circuit is reading data;

a data outputting circuit for outputting the data read by said reading circuit and the data restored by said restoring circuit; and a parity outputting circuit for directly reading and outputting the parity data stored in said memory.

2. A semiconductor memory device according to claim 1, wherein said parity outputting circuit outputs the parity data via a terminal which is the same as a terminal through which said data outputting circuit outputs data.

3. A semiconductor memory device capable of simultaneously reading data and refreshing data, comprising:

a data inputting circuit for receiving data inputted from an external circuit;

a parity generating circuit for generating parity data from the data input from said data inputting circuit;

a memory for storing the data input from said data inputting circuit and the parity data generated by said parity generating circuit;

a refreshing circuit for refreshing said memory;

a reading circuit for reading the data from said memory;

a restoring circuit for restoring data to be refreshed by said refreshing circuit from other data read normally and corresponding parity data, while said reading circuit is reading data;

a data outputting circuit for outputting the data read by said reading circuit and the data restored by said restoring circuit; and a writing circuit for directly writing desired data supplied from an external circuit in an area of said memory where said parity data is stored.

4. A semiconductor memory device according to claim 3, wherein said writing circuit inputs said desired data via a terminal which is the same as a terminal through which said data inputting circuit inputs data.

5. A semiconductor memory device according to claim 3, further comprising a parity outputting circuit for reading and directly outputting said parity data stored in said memory.

6. A semiconductor memory device capable of simultaneously reading data and refreshing data, comprising:

a data inputting circuit for receiving data inputted from an external circuit;

a parity generating circuit for generating parity data from the data input from said data inputting circuit;

a memory for storing the data input from said data inputting circuit and the parity data generated by said parity generating circuit;

a refreshing circuit for refreshing said memory;

a reading circuit for reading the data from said memory;

a restoring circuit for restoring data to be refreshed by said refreshing circuit from other data read normally and corresponding parity data, while said reading circuit is reading data;

a data outputting circuit for outputting the data read by said reading circuit and the data restored by said restoring circuit;

a control circuit for controlling said refreshing circuit to refresh a given area according to a request from an external circuit; and a writing circuit for directly writing desired data supplied from an external circuit in an area of said memory where said parity data is stored, and said control circuit controls said refreshing circuit to refresh an area specified by the external circuit.

7. A semiconductor memory device according to claim 6, wherein said control circuit disables refreshing operation on all areas of said memory, and said data outputting circuit outputs data which is not restored based on parity data.

8. A semiconductor memory device according to claim 6, wherein said control circuit controls said refreshing circuit to refresh an area specified by the external circuit, and said data outputting circuit outputs data read from said area to be refreshed and restored based on parity data.

* * * * *